US012804856B2

(12) United States Patent
Zheng et al.

(10) Patent No.: US 12,804,856 B2
(45) Date of Patent: Nov. 17, 2026

(54) COMPACT LIQUID COOLING UNIT AND ENERGY STORAGE CONTAINER

(71) Applicant: Shenzhen Envicool Technology Co., Ltd., Shenzhen (CN)

(72) Inventors: Honghao Zheng, Shenzhen (CN); Jianpan Liang, Shenzhen (CN); Gang Wu, Shenzhen (CN); Qingzhen Zeng, Shenzhen (CN); Baohui Shui, Shenzhen (CN); Shuifu Yang, Shenzhen (CN); Yaoping Qin, Shenzhen (CN); Zhuxiang Wang, Shenzhen (CN)

(73) Assignee: SHENZHEN ENVICOOL TECHNOLOGY CO., LTD., Shenzhen (CN)

( * ) Notice: Subject to any disclaimer, the term of this patent is extended or adjusted under 35 U.S.C. 154(b) by 297 days.

(21) Appl. No.: 18/607,595

(22) Filed: Mar. 18, 2024

(65) Prior Publication Data

US 2024/0224472 A1 Jul. 4, 2024

Related U.S. Application Data

(63) Continuation of application No. PCT/CN2023/114421, filed on Aug. 23, 2023.

(30) Foreign Application Priority Data

Dec. 26, 2022 (CN) ......................... 202211677947.7

(51) Int. Cl.
*H05K 7/20* (2006.01)
*H05K 5/02* (2006.01)

(52) U.S. Cl.
CPC ....... *H05K 7/20681* (2013.01); *H05K 5/0213* (2013.01); *H05K 7/20318* (2013.01); *H05K 7/20327* (2013.01); *H05K 7/20572* (2013.01)

(58) Field of Classification Search
CPC ........... H05K 7/20681; H05K 7/20318; H05K 7/20327; H05K 7/20572; H05K 7/2079; H05K 5/0213
See application file for complete search history.

(56) References Cited

U.S. PATENT DOCUMENTS 6,182,742 B1 * 2/2001 Takahashi .......... H05K 7/20281 165/200
8,537,536 B1 * 9/2013 Rembach ............. H05K 7/1497 361/679.48

(Continued)

FOREIGN PATENT DOCUMENTS

CN 205793925 U * 12/2016
CN 116014283 A 4/2023
CN 219371118 U 7/2023

OTHER PUBLICATIONS

CN-205793925-U English translation (Year: 2016).*
International Search Report of PCT Patent Application No. PCT/CN2023/114421 issued on Oct. 30, 2023.

*Primary Examiner* — Jayprakash N Gandhi
*Assistant Examiner* — Matthew Sinclair Muir
(74) *Attorney, Agent, or Firm* — Andrew C. Cheng

(57) ABSTRACT

A liquid cooling unit is arranged at an end surface of a casing of a energy storage container. The liquid cooling unit includes a cabinet having an accommodation space and a heat dissipation assembly arranged in the accommodation space. The cabinet includes a first surface adjacent to the end surface and a second surface adjacent to a side surface of the container casing and adjacent to the first surface. The direction in which the first surface faces defines a first servicing direction of the liquid cooling unit, and the direction in which the second surface faces defines a second servicing direction of the liquid cooling unit. The heat dissipation assembly is structured to be serviceable in the (Continued)

first servicing direction and the second servicing direction to realize servicing of most of components of the unit without pulling the unit to outside of the container casing for servicing.

20 Claims, 7 Drawing Sheets

(56) References Cited

U.S. PATENT DOCUMENTS

| | | | | |
|---|---|---|---|---|
| 2012/0134107 | A1* | 5/2012 | Peng | H05K 7/2079 361/679.53 |
| 2021/0068306 | A1* | 3/2021 | Bailey | H05K 7/20836 |
| 2023/0142053 | A1* | 5/2023 | Archibald | H05K 7/20272 700/282 |

* cited by examiner

COMPACT LIQUID COOLING UNIT AND ENERGY STORAGE CONTAINER

CROSS-REFERENCE TO RELATED APPLICATIONS

This application is a continuation of International Application No. PCT/CN2023/114421, filed on Aug. 23, 2023, which claims priority to Chinese Patent Application No. 202211677947.7, filed on Dec. 26, 2022. All of the aforementioned patent applications are hereby incorporated by reference in their entireties.

FIELD OF THE INVENTION

The application relates to the technical field of heat dissipation, and more particularly to a liquid cooling unit and an energy storage container.

DESCRIPTION OF THE RELATED ART

With the continuous progress of the energy storage technology, containerized battery energy storage systems show a trend of adopting liquid cooling for heat dissipation, because the liquid cooling solution has a higher efficiency and a more uniform overall temperature control, realizing lower temperature rise, and supporting high multiple charging/discharging applications. However, during practical applications, the inventor found the existing techniques surfer at least the following problems. The existing containerized battery energy storage system intends to arrange as many batteries as possible in the interior of the container to enhance the charging/discharging capacity of the battery module, yet the size of the container is generally fixed, so that increasing the number of batteries would inevitably reduce the space that a liquid cooling unit may occupy, or even such that side surfaces of the liquid cooling unit are positioned tightly against the container and the back surface close to a power module. When malfunctioning of the liquid cooling unit occurs, it needs to first remove the connecting pipes of the liquid cooling unit in order to be pullable outside the container for carrying out servicing on the liquid cooling unit. Such an operation is tedious and would greatly increase the time cost and labor cost.

SUMMARY OF THE INVENTION

This application provides an improved liquid cooling unit and energy storage container, to allow servicing of most of components of the unit without pulling the unit outside of the container casing for servicing.

In one aspect, the application provides a liquid cooling unit which comprises a cabinet that defines an accommodation space; and a heat dissipation assembly arranged in the accommodation space. The cabinet comprises a first surface facing a first direction and a second surface facing a second direction, the first surface being formed with a first opening so that a first servicing direction of the liquid cooling unit is formed in the first direction, the second surface neighboring to the first surface and formed with a second opening so that a second servicing direction of the liquid cooling unit is formed in the second direction, whereby the heat dissipation assembly being serviceable in the first servicing direction and the second servicing direction.

In some embodiments, the heat dissipation assembly comprises a first circulation system and a second circulation system, the first circulation system comprising at least two compressors which are arranged adjacent to the second surface so as to be serviceable in the second servicing direction, the second circulation system comprising at least two water pumps which are arranged adjacent to the first surface so as to be serviceable in the first servicing direction.

In some embodiments, the heat dissipation assembly further comprises an electric control component which is rotatably mounted to a lower portion of the cabinet and located between the first surface and the at least two water pumps.

In some embodiments, the electric control component is rotatably connected by a hinge to the cabinet and is arranged distant from the second surface.

In some embodiments, the heat dissipation assembly comprises a first circulation system, a second circulation system, and a heat exchanger; the first circulation system is a condensing system which comprises a blower, a condenser, and a compressor; the second circulation system is a water cooling system which comprises a plurality of water pumps; and the heat exchanger comprises a condensing channel and a water cooling channel, the condensing channel being connected with the first circulation system, the water cooling channel being connected with the second circulation system.

In some embodiments, the first circulation system comprises two blowers and an expansion valve arranged in the accommodation space; two blowers and the condenser being arranged side by side in an upper area of the accommodation space, the condenser being arranged adjacent to the second surface, two blowers being arranged in the cabinet and distant from the second surface, the condenser being located between the blowers and the second surface, the compressor being located at an underside of the condenser.

In some embodiments, the second circulation system further comprises an expansion tank, a heater, an exhaust valve, and a water supplementing tank, the heater being located at an underside of two blowers, the heat exchanger being located at underside of the heater and adjacent to the first surface, the expansion tank being located at an underside of the compressor and adjacent to the second surface, the exhaust valve being located between the heat exchanger and the expansion tank, the at least two water pumps being located under the exhaust valve.

In some embodiments, the heat dissipation assembly further comprises a pipeline assembly which comprises a pipeline connection port, the pipeline connection port being arranged at a bottom of the cabinet and adjacent to the second surface.

In some embodiments, the cabinet further comprises an air inlet and an air outlet in communication with each other; the air inlet is arranged in one of the first surface and the second surface, and the air outlet is arranged in another one of the first surface and the second surface; and the blower has an air inlet side that faces the air inlet, and the condenser is located between the blower and the air inlet.

In some embodiments, the cabinet further comprises a first cabinet board arranged on the first surface and a second cabinet board arranged on the second surface, the first cabinet board and the second cabinet board being detachably connected to the cabinet; and the air inlet is arranged in one of the first cabinet board and the second cabinet board, and the air outlet is arranged in another one of the first cabinet board and the second cabinet board.

In some embodiments, the cabinet is of a rectangular parallelepiped shape and comprises a long-edge side, a short-edge side, and a height side mutually perpendicular to one another, the first servicing direction of the liquid cooling unit corresponding to the long-edge side of the cabinet, the second servicing direction of the liquid cooling unit corresponding to the short-edge side of the cabinet.

In some embodiments, the heat dissipation assembly comprises a first circulation system and a second circulation system, the first circulation system comprises a compressor, a condenser and a blower; the blower and the condenser are arranged to space from each other along the long-edge side of the cabinet; the compressor and the condenser are arranged along the height side of the cabinet, and the compressor is located under the condenser; and the liquid cooling unit further comprises an air inlet and an air outlet in communication with each other, the air inlet facing the condenser, the condenser being located between the blower and the air inlet.

In some embodiments, the second circulation system comprises a water pump, the water pump having an axial direction that is parallel to the long-edge side.

In some embodiments, the cabinet comprises a plurality of upright columns arranged to space from each other and cross beams connected between adjacent ones of the upright columns, the first opening and the second opening being respectively formed between corresponding ones of the upright columns and the cross beams.

In some embodiments, the heat dissipation assembly comprises a compressor, a blower, and a condenser received in the accommodation space; the blower and the condenser are arranged in an upper area of the accommodation space and are arranged side by side in a direction parallel to the first surface of the cabinet, the condenser being closer to the second surface of the cabinet than the blower so that the condenser is serviceable in either one of the first servicing direction and the second servicing direction; and the compressor is located under the condenser and adjacent to the second surface of the cabinet, so that the compressor is serviceable in the second servicing direction.

In some embodiments, the heat dissipation assembly comprises two condensers, and two condensers are arranged in a V-shaped configuration, and the V-shaped configuration has an opening that faces toward the blower.

In some embodiments, the heat dissipation assembly further comprises a water pump and an electric control component received in a lower area of the accommodation space, the electric control component being rotatably mounted to the cabinet and located between the first surface and the water pump, so that when the electric control component is rotated to an open position, the water pump is exposed in the first servicing direction to have the water pump serviceable in the first servicing direction.

In another aspect, the application provides an energy storage container comprising a container casing, and the liquid cooling unit described above. The container casing is of a rectangular parallelepiped shape and comprises two side surfaces perpendicular to a widthwise direction thereof, and two end surfaces perpendicular to a lengthwise direction thereof, the first surface of the liquid cooling unit facing one of the end surfaces of the container casing, the second surface of the liquid cooling unit facing one of the side surfaces of the container casing.

In a further another aspect, the application provides an energy storage container comprising a container casing. The energy storage further comprises two liquid cooling units described above. The two liquid cooling units are arranged side by side horizontally along an end surface of the container casing, the two liquid cooling units being arranged in mirror symmetry.

In some embodiments, the container casing is of a rectangular parallelepiped shape and comprises two side surfaces perpendicular to a widthwise direction thereof and two end surfaces perpendicular to a lengthwise direction thereof, the two liquid cooling units having air inlet sides respectively facing the two side surfaces of the container casing and being spaced from respective ones of the side surfaces by predetermined distances to form servicing tunnels, the first surfaces of the two liquid cooling units commonly facing a same one of the end surfaces of the container casing, the second surfaces of the two liquid cooling units respectively facing the two side surfaces of the container casing.

DETAILED DESCRIPTION OF PREFERRED EMBODIMENTS OF THE INVENTION

Figure 1:
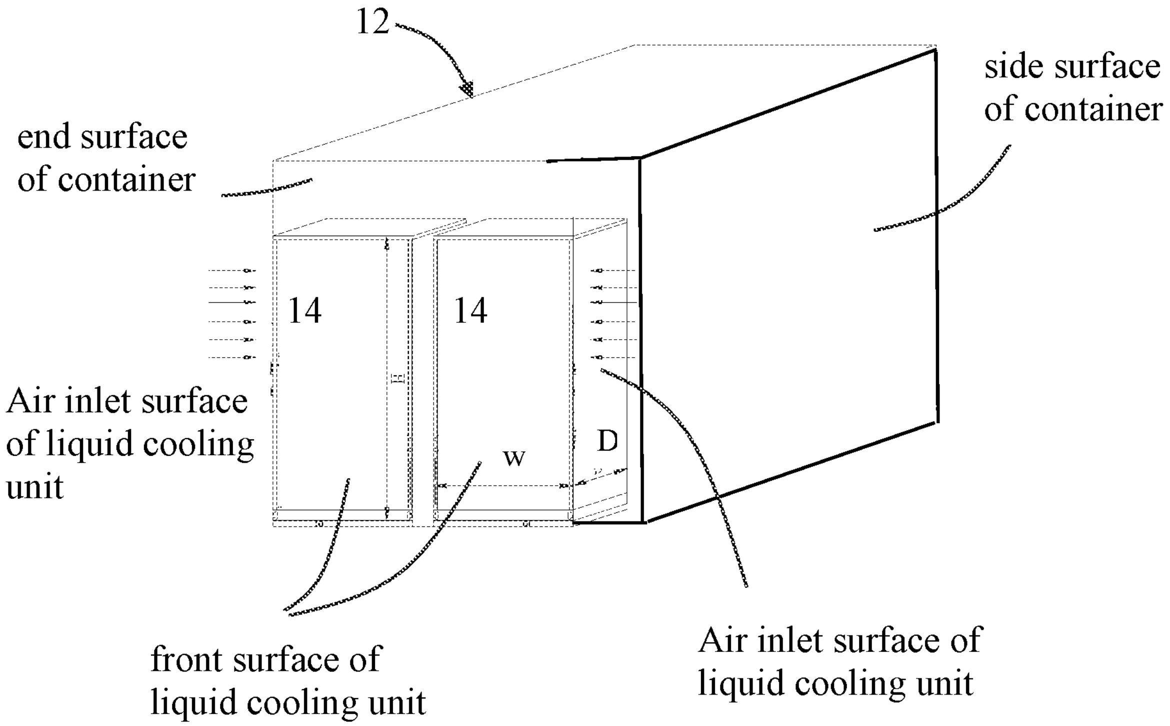
FIG. 1 is a schematic perspective view showing an illustrative example of an energy storage container of the application.

Prior to describing embodiments in detail, it is noted that the application is not limited to the detailed structure or component arrangement illustrated in the disclosure or the drawings of the application. The application may include embodiments that are implementable in other ways. Further, it is noted that the language and terminology used in the disclosure are adopted only for purposes of illustration and should not be construed in a limiting way. The terms "comprise", "include", and "have", which are literally similar, as used herein means that items listed thereafter, objects equivalent thereto, and other attached items are all included. Particularly, when "an element" is being mentioned, the application does not intentionally limit the number of such an element is just one and may include multiple ones of such an element.

In the embodiments of the application, all directional references (such as top, down, left, right, front, and rear) are only applied to describe relative positional relationships and motion statuses of components in a specific posture (as that shown in the drawings), and once the specific posture changes, the directional references change according thereto.

Figure 2:
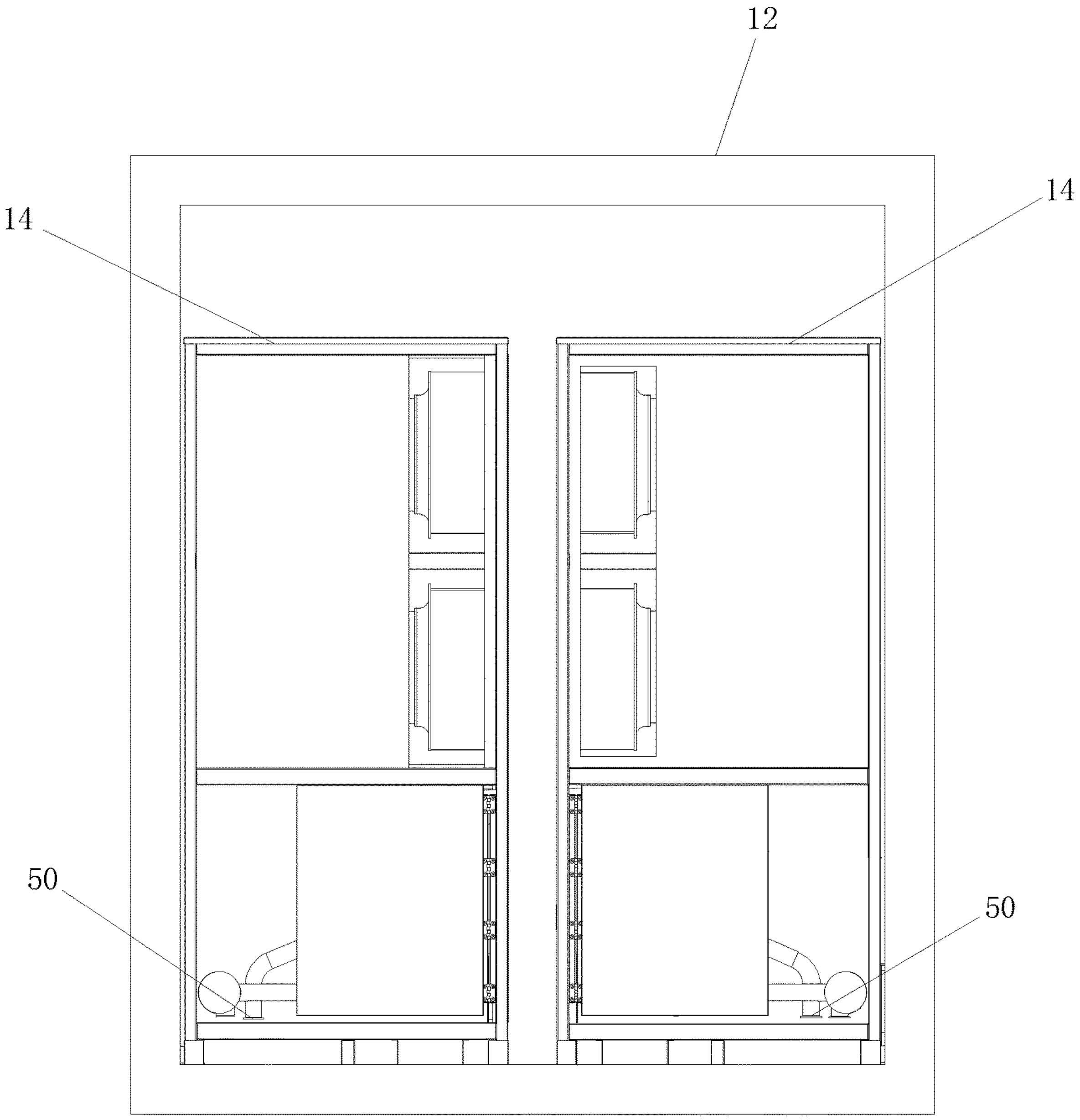
FIG. 2 is a schematic view of the energy storage container of FIG. 1 taken from a front side.

As shown in FIGS. 1-2, the application provides an energy storage container. The energy storage container comprises a liquid cooling unit 14 and a container casing 12. The liquid cooling unit 14 is arranged in an interior of the container casing 12 and at one side of an end surface of the container casing 12. In the instant embodiment, two liquid cooling units 14 are included, and the two liquid cooling units 14 are arranged side by side horizontally along the end surface of the container casing 12 and spaced from each other, and the two liquid cooling units 14 are arranged in mirror symmetry. Internal components received inside of the two liquid cooling units 14 are switchable and replaceable with each other, and the liquid cooling units 14 can be arranged as a left-side pipe-exiting unit or a right-side pipe-exiting unit by adjusting arrangement of the internal components thereof and partly adjusting pipelines, and as such, transferability of the unit components is greatly enhanced. The two liquid cooling units 14 are arranged in mirror symmetry, so that components are completely interchangeable, and other structural members are almost interchangeable thereby improving standardization and transferability, lowering purchase expenditure of devices, and increasing production efficiency.

The container casing 12 of the application adopts the specification of a 20-foot container (length 6058*width 2438*height 2896), which includes two side surfaces perpendicular to a widthwise direction of the container casing 12, two end surfaces perpendicular to a lengthwise direction of the container casing 1, and a top surface and a bottom surface perpendicular to a heightwise direction of the container casing 12. Subtracting the upright columns and door panel thickness of the container, an internal end of the container casing 12 in the lengthwise direction (which is one end in the lengthwise direction) may receive the two liquid cooling units 14 to arrange side by side in the widthwise direction of the container. A front surface of the liquid cooling units 14 faces toward one end surface of the container casing 12, and the direction that the front surface of the liquid cooling units 14 faces is a first servicing direction and an air outlet direction, and one side surface of the liquid cooling unit 14 is an air inlet side. The air inlet side faces toward one side surface of the container casing 12. The direction that the air inlet side faces is a second servicing direction. The first servicing direction and the second servicing direction are arranged to form an included angle, such as a 90-degree angle, so that internal components of the liquid cooling unit 14 that are susceptible to damage can be serviced without first pulling the liquid cooling unit 14 out of the container casing 12, so that servicing is made easy and cost of service is reduced. In the instant embodiment, a width of the liquid cooling unit 14 in the first servicing direction is greater than a width thereof in the second servicing direction, and the first servicing direction is a primary servicing direction, and the second servicing direction is a secondary servicing direction. Arranging in this way allows servicing of most of the components to be carried out easily in the primary servicing direction. It is appreciated that in other embodiments, the first servicing direction can be taken as the secondary servicing direction, while the second servicing direction is taken as the primary servicing direction.

In the illustrated embodiment, the container casing 12 and the liquid cooling units 14 are both of a rectangular parallelepiped configuration. The liquid cooling unit 14 has a width W (FIG. 4) that is defined as a dimension in a horizontal direction for observation of the liquid cooling unit 14 made from the end surfaces of the container casing 12 (i.e., a dimension parallel to the widthwise direction of the container casing 12); the liquid cooling unit 14 has a depth D (FIG. 4) that is defined as a dimension in a horizontal direction for observation of the liquid cooling unit 14 made from the side surfaces of the container casing 12 (i.e., a dimension parallel to the lengthwise direction of the container casing 12); and the liquid cooling unit 14 has a height H (FIG. 4) that is defined as a dimension in a vertical direction from the bottom surface to the top surface of the liquid cooling unit 14. In the instant embodiment, the liquid cooling unit 14 has a widthwise direction that is the direction in which a long-edge side of the liquid cooling unit 14 is located; the liquid cooling unit 14 has a depthwise direction that is the direction in which a short-edge side of the liquid cooling unit 14 is located. The first surface 18 of the liquid cooling unit 14 is the surface on which the long-edge side of the liquid cooling unit 14 is located and is perpendicular to the depthwise direction of the liquid cooling unit 14; and the second surface 20 of the liquid cooling unit 14 is the surface on which the short-edge side of the liquid cooling unit 14 is located and is perpendicular to the widthwise direction of the liquid cooling unit 14. Among surfaces of the liquid cooling unit 14 that are parallel to the widthwise direction, the one that is closest to the end surface of the container casing 12 is a front surface of the liquid cooling unit 14; among surfaces of the liquid cooling unit 14 that are parallel to the depthwise direction, the one that is closest to the side surface of the container casing 12 is an air inlet side of the liquid cooling unit 14, and the liquid cooling unit 14 gets ingress of air from the air inlet side, and makes egress of air through the front surface. In other words, the first servicing direction of the liquid cooling unit 14 corresponds to the end surface of the container casing 12, and the second servicing direction of the liquid cooling unit 14 corresponds to the side surface of the container casing 12.

Another one of the end surfaces of the container casing 12 and the two liquid cooling units 14 define therebetween a space for installation of a plurality of batteries for energy storage, while the liquid cooling units 14 function for heat dissipation from and temperature reduction of the plurality of batteries. The air inlet side of the liquid cooling unit 14 faces toward the side surface of the container casing 12 and is spaced from a sidewall of the container casing 12 by a predetermined distance, so that a servicing tunnel is formed between the air inlet side of the liquid cooling unit 14 and the sidewall of the container casing 12 corresponding thereto to allow a servicing operator to enter in the servicing tunnel to carry out servicing on the liquid cooling unit 14 in the second servicing direction.

In the illustrated embodiment, the liquid cooling units 14 are mounted on the bottom surface in the interior of the container casing 12, and the liquid cooling units 14 have a height that is smaller than a height of the container casing 12. Since the two liquid cooling units 14 are arranged in mutual mirror symmetry, in the following only one of the liquid cooling units 14 will be described, such as the liquid cooling unit 14 that is located in a right side of the interior of the container casing 12 being taken as an example for detailed description.

It is also noted that in other embodiments, following the requirements of an actual design and the requirements for size design of the container, there can be just one liquid cooling unit 14 or more than two such units, and the application does not impose constraints to the number of the liquid cooling unit 14 that is involved.

Figure 3:
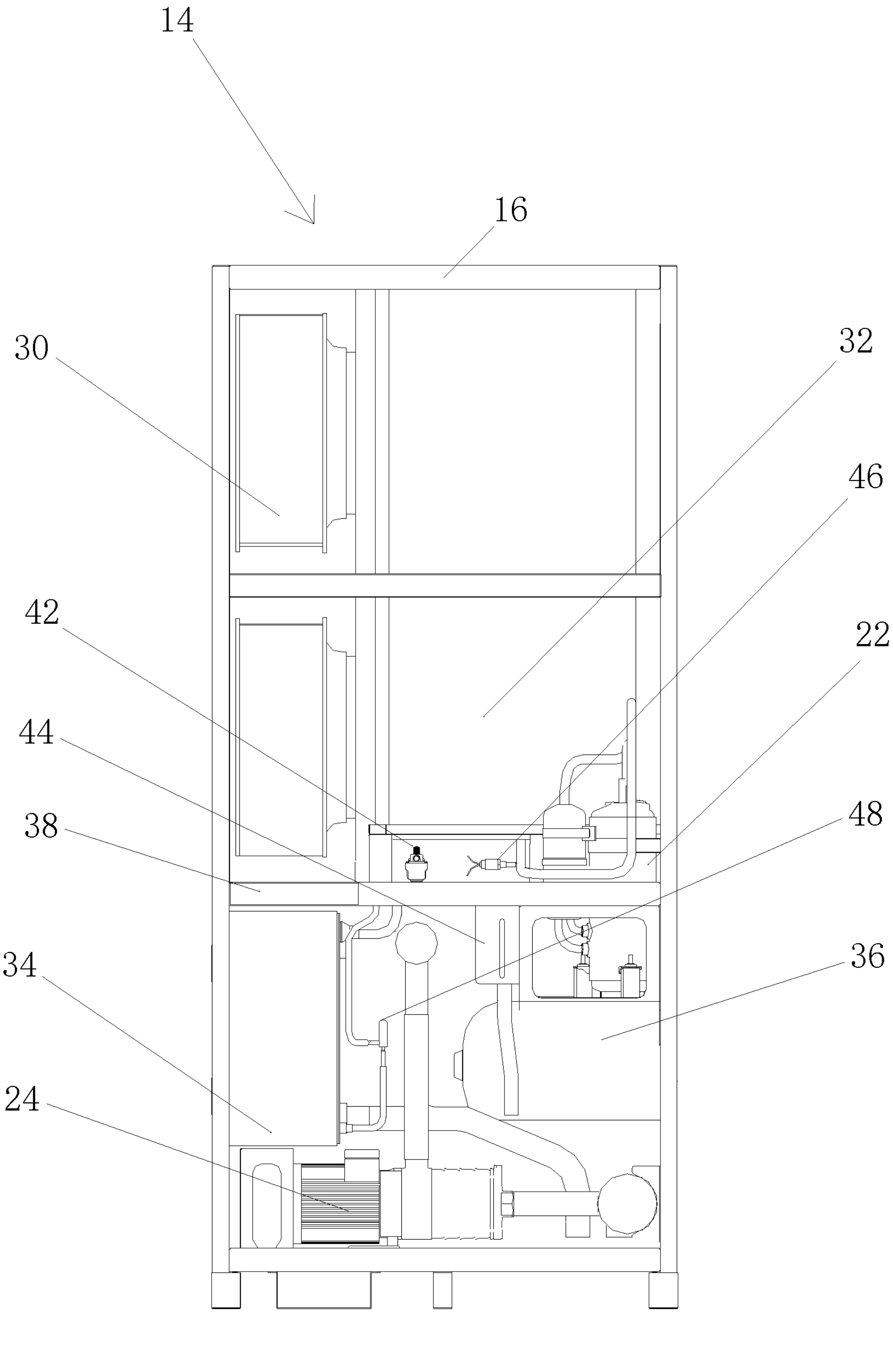
FIG. 3 is a schematic view showing an interior structure of a liquid cooling unit of FIG. 1.
Figure 4:
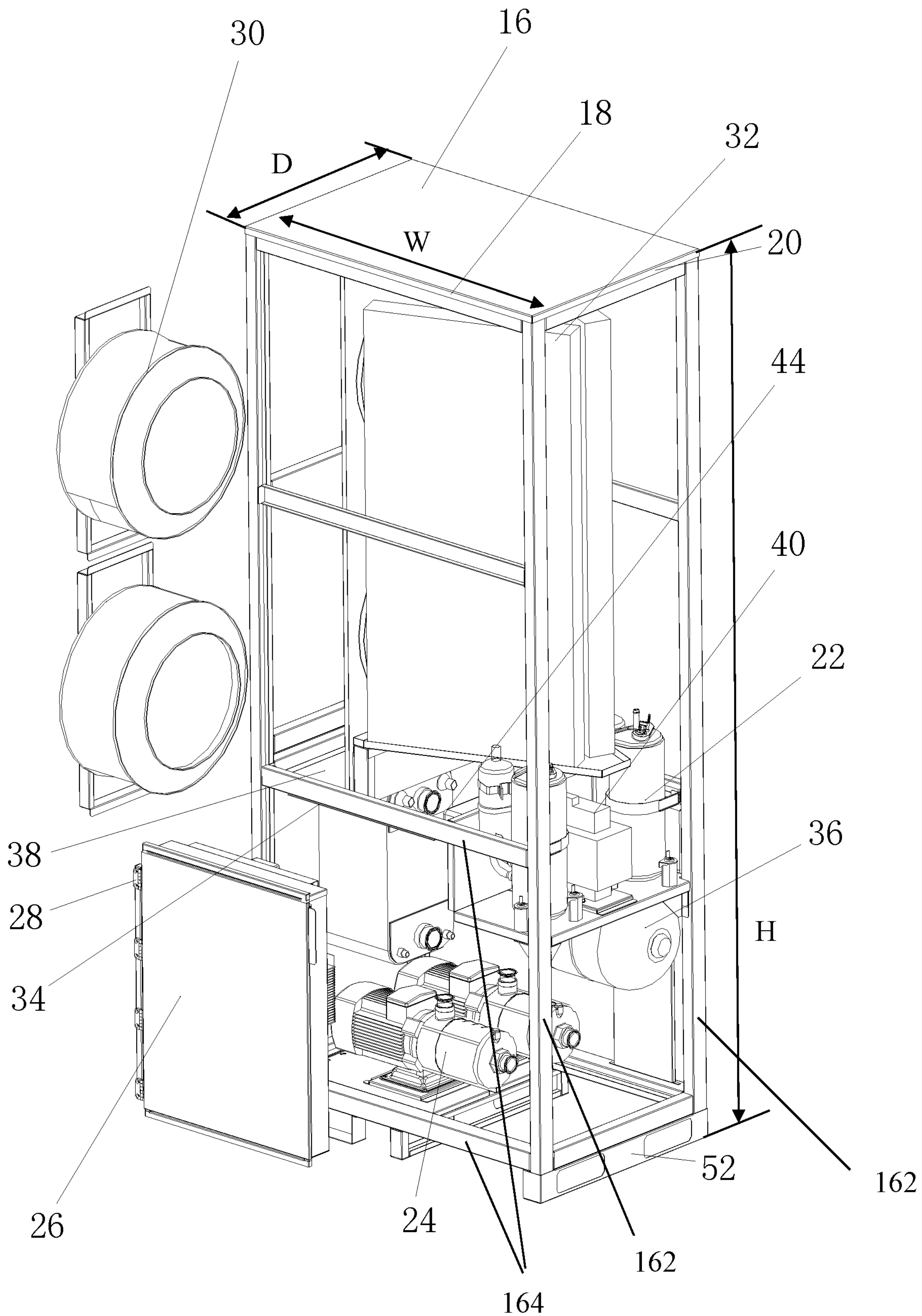
FIG. 4 is an exploded view of the liquid cooling unit of FIG. 1.

Referring to FIGS. 3 and 4, the liquid cooling unit 14 comprises a cabinet 16 that comprises an accommodation space and a heat dissipation assembly arranged in the accommodation space of the cabinet 16. The cabinet 16 comprises a first surface 18 that is adjacent to the end surface of the container casing 12 at one end of the lengthwise direction and a second surface 20 that is adjacent to the side surface on which the long edge of the container casing 12 is located (namely the side surface that is perpendicular to the widthwise direction of the container casing 12) and adjacent to the first surface 18. The direction in which the first surface 18 exactly faces (namely the direction of the normal line of the first surface 18) forms a first servicing direction of the liquid cooling unit 14, and the direction in which the second surface 20 exactly faces (namely the direction of the normal line of the second surface 20) forms a second servicing direction of the liquid cooling unit 14. The cabinet 16 comprises a plurality of upright columns 162 that are arranged to space from each other and cross beams 164 connected between adjacent ones of the upright columns 162. The upright columns 162 and the cross beams 164 define therebetween a plurality of openings/widows through which the heat dissipation assembly is exposed. Covering plates may be mounted on the openings in the top surface of the cabinet 16, or if desired, no covering plate may be installed. If desired, cabinet boards may be mounted on the openings in the side surfaces of the cabinet 16. The heat dissipation assembly is structured and configured to enable servicing to be carried out in the first servicing direction and the second servicing direction of the liquid cooling unit 14, meaning by means of a reasonable arrangement of the heat dissipation assembly, when servicing of the heat dissipation assembly is desired, without first removing other components or devices from the interior of the assembly, the servicing operator may directly carry out servicing on the heat dissipation assembly in the first servicing direction and the second servicing direction without moving the assembly out of the container, suiting the need for servicing most of the devices in the interior of the cabinet 16 from the front surface and one of the side surfaces of the liquid cooling unit.

Figure 5:
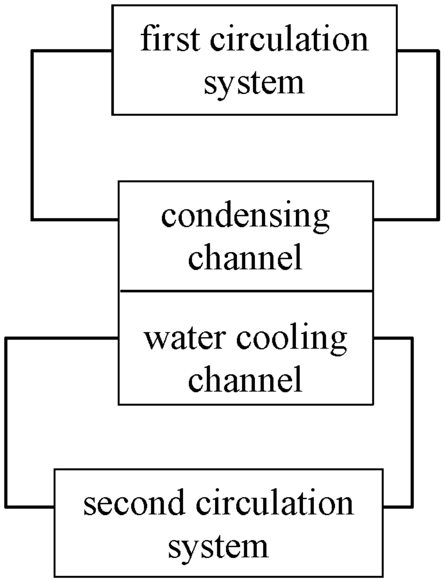
FIG. 5 is a schematic view showing a heat dissipation assembly of the liquid cooling unit of FIG. 1.

Referring to FIG. 5, the heat dissipation assembly comprises a first circulation system, a second circulation system, and a heat exchanger in thermal coupling between the first circulation system and the second circulation system. The first circulation system and the second circulation system exchange heat with each other through the heat exchanger, meaning the heat exchanger is provided therein with a water cooling channel (which is a channel through which cooling water flows) and a condensing channel (which is a channel through which a liquid is formed by condensation of a condensable gas). Wherein the water cooling channel is connected with the second circulation system and in communication with a water pump 24. The condensing channel is connected with the first circulation system, and the condensing channel is in communication with a condenser 32, and the condenser 32 is connected to a compressor 22. The condensing channel can be a straight condenser pipe or a serpentine condenser pipe. The heat exchanger adopts a plate type heat exchanger 34, and can of course be a cylinder type heat exchanger or other types of heat exchanger.

In some embodiments, the heat dissipation assembly may comprise two first circulation system. The condensers 32 of the two first circulation systems are vertically upward arranged on an upper portion of the cabinet 16, and the two condensers 32 are arranged in a V-shaped configuration, and an opening of the V-shape faces toward an external blower 30. In the direction of the width W of the cabinet 16, the condensers 32 are located between the external blower 30 and the second surface 20, and preferably, a center axis of the opening of the V-shape exactly corresponds to a center axis of the external blower 30. Of course, in other embodiments, the condenser 32 can be arranged in a left-right side-by-side manner or arranged in other ways.

In some embodiments, the second circulation system of the heat dissipation assembly may comprise at least two water pumps 24, and the two water pumps 24 are respectively connected in parallel with the circulation pipelines, so that when one of the water pumps 24 fails, the other one of the water pumps 24 still operate normally, to thereby improve the system reliability.

In some embodiments, the first circulation system comprises at least two compressors 22 arranged in the accommodation space, and the second circulation system comprises at least two water pumps 24 arranged in the accommodation space. In the illustrated embodiment, two compressors 22 are installed, and two water pumps 24 are installed. The two compressors 22 are arranged adjacent to the second surface 20 and are arranged symmetric in the depthwise direction of the cabinet 16. The two compressors 22 are arranged at a location as close to a bottom of the second surface 20 as possible, so that the two compressors 22 can be exposed through the openings in the second surface 20. When the compressors 22 become malfunctioning, servicing of the malfunctioning compressors 22 can be conducted in the second servicing direction. The two water pumps 24 are arranged adjacent to the first surface 18, and preferably, the water pumps 24 are in an elongated form, and an axial direction of the water pumps 24 is generally parallel to the first surface 18, so that the two water pumps 24 can be exposed through the openings in the first surface 18, and when the water pumps 24 become malfunctioning, servicing of the malfunctioning water pumps 24 can be conducted in the first servicing direction. Further, the assembly adopts a dual-compressor, dual-water pump solution, so that the reliability is high, the structure is compact, and the overall size suits the needs of installation in application sites. Generally, for satisfying the desired capability of cooling, the operation is conducted with dual compressors and dual water pumps, and when one of the compressors or the water pumps becomes malfunctioning, the cooling system may still maintain operating with the other one of the compressors or the other one of the water pumps, thereby greatly reducing the probability of abnormal shut down of the assembly and ensuring a persistently cooling and heat-dissipating environment inside the container casing 12.

The heat dissipation assembly further comprises an electric control system that is operable to control electronic components of the first and second circulation systems. In the instant embodiment, the electric control system is in the form of an electric control component 26, and the electric control component 26 is mounted, in a rotatable manner, in the cabinet 16 at a lower side area of the first surface 18. In the illustrated embodiment, the electric control component 26 is rotatably connected, by means of a hinge 28, to one side of the cabinet 16 that is distant from the second surface 20 to enable ease servicing of the electric control component 26 in the first servicing direction. Of course, in other embodiments, the electric control component 26 can be rotatably connected to the cabinet 16 by means of other rotatable connection structure, such as an arrangement of a combination of a rotary axle and an axle hole to realize the rotatable connection between the electric control component 26 and the cabinet 16. Or, in other embodiments, the electric control component 26 can be connected to the cabinet 16 through other detachable arrangements. For example, the electric control component 26 is detachably connected to the cabinet 16 by means of detachable arrangement, such as snap fitting, to enable detachment and service conducted in the first servicing direction of the electric control component 26.

Further, the first circulation system further comprises, arranged in the accommodation space, at least two blowers 30, a condenser 32, a heat exchanger, such as a plate type heat exchanger 34, an expansion valve, such as an electronic expansion valve 48. The second circulation system further comprises main components, including an expansion tank 36, a heater 38, a reactor 40, an exhaust valve, such as an automatic exhaust valve 42, a water supplementing tank 44, and a pressure transducer 46. The condenser 32 can be a fin type heat exchanger (which comprises a plurality of fins stacked together in a manner of being mutually spaced from each other), such as a V-shaped fin type heat exchanger. In the instant embodiment, two blowers 30 are provided. The plate type heat exchanger 34, the two water pumps 24, the expansion tank 36, the heater 38, the reactor 40, the automatic exhaust valve 42, the water supplementing tank 44, the pressure transducer 46, and the electronic expansion valve 48 are corresponding to the electric control component 26 in the first servicing direction, and the electric control component 26 is located outside of these components, meaning when the plate type heat exchanger 34, the two water pump 24, the expansion tank 36, the heater 38, the reactor 40, the automatic exhaust valve 42, the water supplementing tank 44, the pressure transducer 46, and the electronic expansion valve 48 become damaged, these components can be exposed and serviced in the first servicing direction by moving the electric control component 26 away from these components (i.e., the electric control component is rotated to an open position). Further, some of these components are adjacent to the second surface 20 can be serviced in the second servicing direction, or servicing of some components can be conducted in both the first servicing direction and the second servicing direction.

More specifically, the two blowers 30 and the condenser 32 are arranged side by side in an upper area of the accommodation space, and the condenser 32 is located adjacent to the side associated with the second surface 20, while the two blowers 30 are arranged adjacent to the side of the cabinet 16 that is distant from the second surface 20, so that the two blowers 30 are easier to be serviced in the first servicing direction, while the condenser 32 can be serviced in both the first servicing direction and the second servicing direction or in any of the directions according to an actual need. The two compressors 22, the automatic exhaust valve 42, the pressure transducer 46, and the water supplementing tank 44 are all located at an underside of the condenser 32, wherein the two compressors 22 are arranged at the underside of the condenser 32 to reduce influence on heat exchange of the condenser 32 by right-side ingress of air to improve heat exchange performance. And, the two compressors 22 are arranged adjacent to one side of the second surface 20, so that the two compressors 22 are easier to service in the second servicing direction. The automatic exhaust valve 42 and the pressure transducer 46 are located at one side of the two compressors 22 that is distant from the second surface 20, so that the automatic exhaust valve 42 and the pressure transducer 46 are easier to service in the first servicing direction. The water supplementing tank 44 is also located at the side of the two compressors 22 that is distant from the second surface 20, and as being blocked by the two compressors 22 and the reactor 40 in the second servicing direction, the water supplementing tank 44 is easier to service in the first servicing direction. The reactor 40 is located between the two compressors 22, and the reactor 40 is located adjacent to one side of the second surface 20, so that the reactor 40 is easier to service in the second servicing direction. The heater 38 is located at an underside of the two blowers 30 and faces exactly to a top side of the electric control component 26, so that, comparatively, the heater 38 is easier to service in the first servicing direction. The plate type heat exchanger 34 is located at an under side of the heater 38 and adjacent to the first surface 18, so that the plate type heat exchanger 34 is easier to service in the first servicing direction. The expansion tank 36 is located at an underside of the two compressors 22 and adjacent to the second surface 20, so that, comparatively, the expansion tank 36 is easier to service in the second servicing direction. The electronic expansion valve 48 is located between the plate type heat exchanger 34 and the expansion tank 36 and faces exactly toward a center position of the electric control component 26, so that the electronic expansion valve 48 is easier to service in the first servicing direction. The two water pumps 24 are located at a bottom of the accommodation space and face exactly toward a lower portion of the electric control component 26, and two water pumps 24 are spaced from the second surface 20 by a predetermined distance, so that, comparatively, the two water pumps 24 are easier to service in the first servicing direction.

In the illustrated embodiment, the heat dissipation assembly further comprises a pipeline assembly, and the pipeline assembly comprises a pipeline connection port 50. The pipeline connection port 50 is arranged at the bottom of the cabinet 16 and adjacent to the second surface 20, so that the pipeline connection port 50 is easier to service in the second servicing direction, while other components of the pipeline assembly can be serviced in the first servicing direction and/or the second servicing direction as desired.

Figure 6:
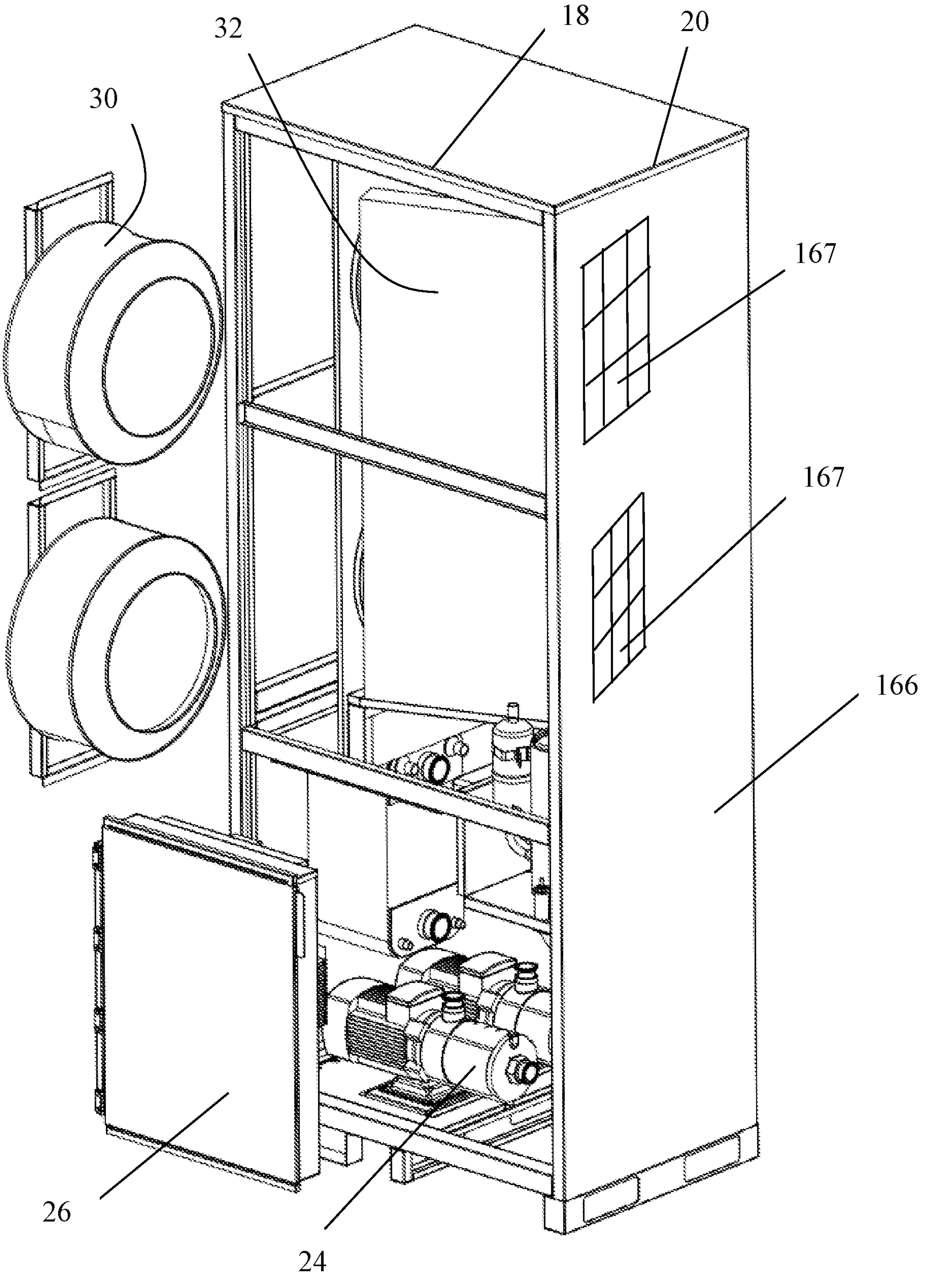
FIG. 6 is a schematic perspective view showing the liquid cooling unit of FIG. 4 after being assembled with a second cabinet board.
Figure 7:
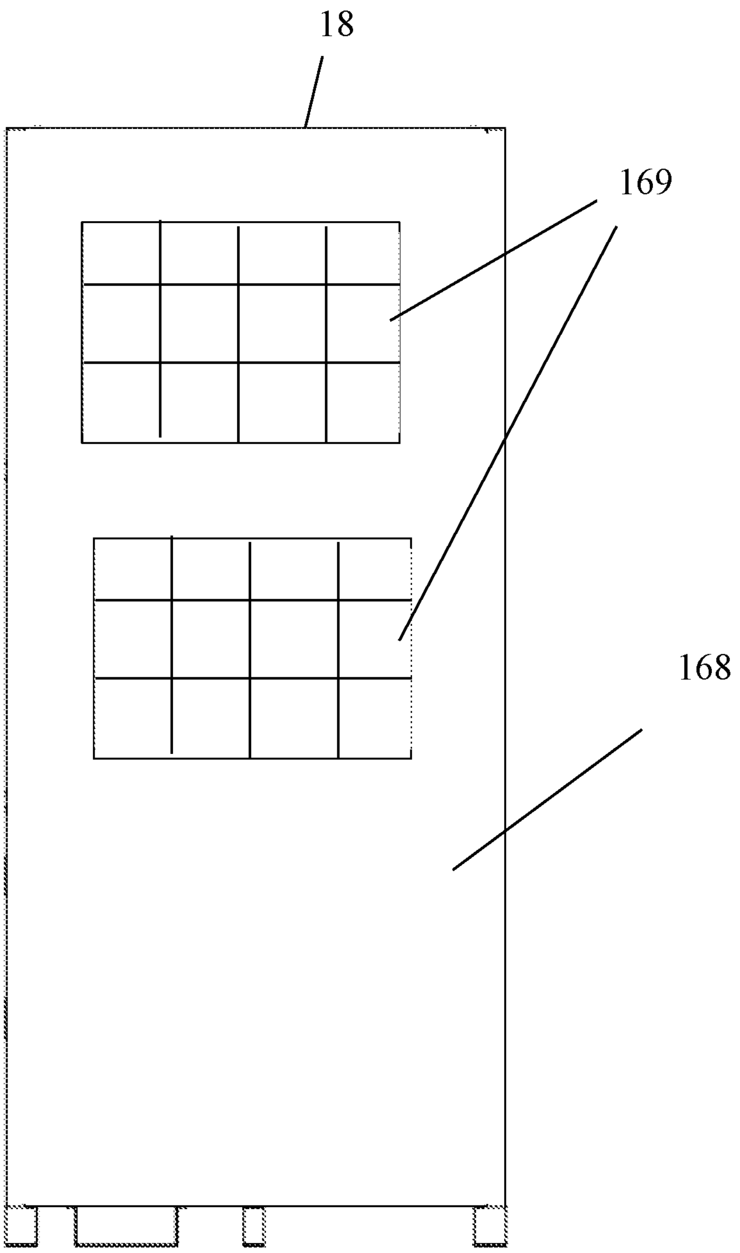
FIG. 7 is a schematic side elevational view showing the first cabinet board of FIG. 1 after being assembled with a liquid cooling unit.

Referring to FIGS. 6 and 7, the cabinet 16 is provided with air inlet 167 in a second cabinet board 166 located on the second surface 20, and the second cabinet board 166 is detachably connected to the upright columns 162 and/or the cross beams 164 of the cabinet 16, such as being detachably mounted by means of bolts, to allow a servicing operator to conduct service on the unit in the second servicing direction. The cabinet 16 is provided with air outlet 169 in a first cabinet board 168 located on the first surface 18, and the first cabinet board 168 is detachably connected to the upright columns 162 and/or the cross beams 164 of the cabinet 16, such as being detachably mounted by means of bolts, to allow a servicing operator to conduct service on the unit in the first servicing direction. The other surfaces of the cabinet 16 can be optionally provided with cabinet boards or forming a partially hollowed arrangement as desired. The air inlet 167 are arranged in the second surface 20 and correspond to the blowers 30. The air outlet 169 are arranged in the first surface 18. The blowers 30 are preferably centrifugal blowers. As such, under the action of the blowers 30, external airflows move through the air inlet 167 of the second surface 20 into the interior of the cabinet 16, passing through the condenser 32 to get into interiors of the blowers 30, and flowing out of the blowers 30 to discharge through the air outlet 169 of the first surface 18 to outside of the cabinet 16.

In the illustrated embodiment, the cabinet 16 is provided, on a bottom thereof, with support blocks 52 to support the cabinet 16 to form a gap with respect to the bottom surface the container casing 12 to enable self-heat dissipation for the liquid cooling unit 14. There are three such support blocks 52 are arranged, and the three support blocks 52 are arranged at uniform intervals and are extended, in an elongated form, in the depthwise direction of the cabinet 16.

Based on the requirements for unit installation, the above solution places limitation on the unit size and the way of pipe exiting, so as to suit the need for desired performance and functionality by means of a reasonable arrangement, and also to satisfy the demand for unit serviceability and fabrication interchangeability. Through compact arrangement of the heat dissipation assembly, the overall unit size of the liquid cooling unit 14 can be reduced to leave more space in the interior of the container casing 12 for installation of more batteries in order to improve the energy storage capacity and charging/discharging capacity of the container.

It is appreciated that in some embodiment, to suit the need for heat dissipation, other numbers of the liquid cooling unit 14 can be arranged in the interior of the container casing 12, such as one, three, or four.

In brief, the application provides a liquid cooling unit and an energy storage container, in which the direction, in which a first surface of a cabinet that is adjacent to an end surface of the container faces, defines a first servicing direction of the liquid cooling unit, and the direction, in which a second surface of the cabinet that is adjacent to a side surface of the container and adjacent to the first surface faces, defines a second servicing direction of the liquid cooling unit. A heat dissipation assembly is arranged in a reasonable manner to make the structure thereof compact and an overall unit size meet the requirement for installation in an application site, and also to allow service of the liquid cooling unit to be conducted in the interior of the container in the first servicing direction and the second servicing direction without first removing connecting pipes, and to allow service of a specific component of the unit to be carried out without first removing other components or devices of the unit, thereby realizing servicing most of the components of the unit from the front surface and one of the side surfaces of the liquid cooling unit, without pulling the unit to outside of the container for servicing, achieving easiness and great reduction of time cost and labor cost.

The concept described in the disclosure can be embodied in other forms without departing from the spirit and features thereof. The specific embodiments disclosed herein should be construed as illustrative, rather than limitative. Thus, the scope of the application is defined by the appended claims, rather than the description provided above. Any variations that fall within the literal meaning and an equivalent scope are considered belonging to the scope of the claims.

What is claimed is:

1. A liquid cooling unit, comprising:

a cabinet that defines an accommodation space, the cabinet comprising a first surface facing a first direction and a second surface facing a second direction, the first surface being formed with a first opening so that a first servicing direction of the liquid cooling unit is formed in the first direction, the second surface neighboring to the first surface and formed with a second opening so that a second servicing direction of the liquid cooling unit is formed in the second direction, whereby the heat dissipation assembly being serviceable in the first servicing direction and the second servicing direction; and a heat dissipation assembly arranged in the accommodation space;

wherein the heat dissipation assembly comprises a first circulation system, a second circulation system, and a heat exchanger;

the first circulation system is a condensing system which comprises a blower, a condenser, and a compressor;

the second circulation system is a water cooling system; and wherein the cabinet further comprises an air inlet and an air outlet in communication with each other;

the air inlet is arranged in one of the first surface and the second surface, and the air outlet is arranged in another one of the first surface and the second surface; and the blower has an air inlet side that faces the air inlet, and the condenser is located between the blower and the air inlet.

2. The liquid cooling unit according to claim 1, wherein the first circulation system comprising at least two compressors which are arranged adjacent to the second surface so as to be serviceable in the second servicing direction, the second circulation system comprising at least two water pumps which are arranged adjacent to the first surface so as to be serviceable in the first servicing direction.

3. The liquid cooling unit according to claim 2, wherein the heat dissipation assembly further comprises an electric control component which is rotatably mounted to a lower portion of the cabinet.

4. The liquid cooling unit according to claim 3, wherein the electric control component is rotatably connected by a hinge to the cabinet and is arranged distant from the second surface.

5. The liquid cooling unit according to claim 1, wherein the water cooling system comprises a plurality of water pumps; and the heat exchanger comprises a condensing channel and a water cooling channel, the condensing channel is connected with the first circulation system, and the water cooling channel is connected with the second circulation system.

6. The liquid cooling unit according to claim 5, wherein the first circulation system comprises two blowers and an expansion valve arranged in the accommodation space; two blowers and the condenser being arranged side by side in an upper area of the accommodation space, the condenser being arranged adjacent to the second surface, two blowers being arranged in the cabinet and distant from the second surface, the condenser being located between the blowers and the second surface, the compressor being located at an underside of the condenser.

7. The liquid cooling unit according to claim 6, wherein the second circulation system further comprises an expansion tank, a heater, an exhaust valve, and a water supplementing tank, the heater being located at an underside of two blowers, the heat exchanger being located at underside of the heater and adjacent to the first surface, the expansion tank being located at an underside of the compressor and adjacent to the second surface, the exhaust valve being located between the heat exchanger and the expansion tank, the water pumps being located under the expansion valve.

8. The liquid cooling unit according to claim 5, wherein the heat dissipation assembly further comprises a pipeline assembly which comprises a pipeline connection port, the pipeline connection port being arranged at a bottom of the cabinet and adjacent to the second surface.

9. The liquid cooling unit according to claim 1, wherein the cabinet further comprises a first cabinet board arranged on the first surface and a second cabinet board arranged on the second surface, the first cabinet board and the second cabinet board being detachably connected to the cabinet; and the air inlet is arranged in one of the first cabinet board and the second cabinet board, and the air outlet is arranged in another one of the first cabinet board and the second cabinet board.

10. The liquid cooling unit according to claim 1, wherein the cabinet is of a rectangular parallelepiped shape and comprises a long-edge side, a short-edge side, and a height side mutually perpendicular to one another, the first servicing direction of the liquid cooling unit corresponding to the long-edge side of the cabinet, the second servicing direction of the liquid cooling unit corresponding to the short-edge side of the cabinet.

11. The liquid cooling unit according to claim 10, wherein the blower and the condenser are arranged to space from each other along the long-edge side of the cabinet;

the compressor and the condenser are arranged along the height side of the cabinet, and the compressor is located under the condenser; and the air inlet faces the condenser.

12. The liquid cooling unit according to claim 11, wherein the second circulation system comprises a water pump, the water pump having an axial direction that is parallel to the long-edge side.

13. The liquid cooling unit according to claim 1, wherein the cabinet comprises a plurality of upright columns arranged to space from each other and cross beams connected between adjacent ones of the upright columns, the first opening and the second opening being respectively formed between corresponding ones of the upright columns and the cross beams.

14. A liquid cooling unit, comprising:

a cabinet that defines an accommodation space, the cabinet comprising a first surface facing a first direction and a second surface facing a second direction, the first surface being formed with a first opening so that a first servicing direction of the liquid cooling unit is formed in the first direction, the second surface neighboring to the first surface and formed with a second opening so that a second servicing direction of the liquid cooling unit is formed in the second direction, whereby the heat dissipation assembly being serviceable in the first servicing direction and the second servicing direction; and a heat dissipation assembly arranged in the accommodation space;

wherein the heat dissipation assembly comprises a compressor, a blower, and a condenser received in the accommodation space;

the blower and the condenser are arranged in an upper area of the accommodation space, the condenser being closer to the second surface of the cabinet than the blower so that the condenser is serviceable in either one of the first servicing direction and the second servicing direction; and the compressor is located under the condenser and adjacent to the second surface of the cabinet, so that the compressor is serviceable in the second servicing direction.

15. The liquid cooling unit according to claim 14, wherein the heat dissipation assembly comprises two condensers, and two condensers are arranged in a V-shaped configuration, and the V-shaped configuration has an opening that faces toward the blower.

16. The liquid cooling unit according to claim 15, wherein the heat dissipation assembly further comprises a water pump and an electric control component received in a lower area of the accommodation space, the electric control component being rotatably mounted to the cabinet and located between the first surface and the water pump, so that when the electric control component is rotated to an open position, the water pump is exposed in the first servicing direction to have the water pump serviceable in the first servicing direction.

17. An energy storage container, comprising a container casing, and further comprising the liquid cooling unit according to claim 1, wherein the container casing is of a rectangular parallelepiped shape and comprises two side surfaces perpendicular to a widthwise direction thereof, and two end surfaces perpendicular to a lengthwise direction thereof, the first surface of the liquid cooling unit facing one of the end surfaces of the container casing, the second surface of the liquid cooling unit facing one of the side surfaces of the container casing.

18. An energy storage container comprising a container casing and two liquid cooling units;

wherein each of the two liquid cooling units comprises:

a cabinet that defines an accommodation space, the cabinet comprising a first surface facing a first direction and a second surface facing a second direction, the first surface being formed with a first opening so that a first servicing direction of the liquid cooling unit is formed in the first direction, the second surface neighboring to the first surface and formed with a second opening so that a second servicing direction of the liquid cooling unit is formed in the second direction, whereby the heat dissipation assembly being serviceable in the first servicing direction and the second servicing direction; and a heat dissipation assembly arranged in the accommodation space; and wherein the container casing is of a rectangular parallelepiped shape and comprises two side surfaces perpendicular to a widthwise direction thereof and two end surfaces perpendicular to a lengthwise direction thereof, the two liquid cooling units having air inlet sides respectively facing the two side surfaces of the container casing and being spaced from respective ones of the side surfaces by predetermined distances to form servicing tunnels, the first surfaces of the two liquid cooling units commonly facing a same one of the end surfaces of the container casing, the second surfaces of the two liquid cooling units respectively facing the two side surfaces of the container casing.

19. The energy storage container according to claim 18, wherein the two liquid cooling units are arranged side by side horizontally along one of the two end surfaces of the container casing.

20. The energy storage container according to claim 19, wherein the two liquid cooling units are arranged in mirror symmetry.

* * * * *